(12) United States Patent
Holma et al.

(10) Patent No.: US 9,888,602 B2
(45) Date of Patent: Feb. 6, 2018

(54) CIRCUIT BOARD SYSTEM COMPRISING A SPRING FASTENED ELEMENT

(71) Applicant: TELLABS OY, Espoo (FI)

(72) Inventors: Antti Holma, Espoo (FI); Heikki Jekunen, Espoo (FI); Jari-Pekka Laihonen, Espoo (FI)

(73) Assignee: CORIANT OY, Espoo (FI)

( * ) Notice: Subject to any disclaimer, the term of this patent is extended or adjusted under 35 U.S.C. 154(b) by 314 days.

(21) Appl. No.: 14/035,171

(22) Filed: Sep. 24, 2013

(65) Prior Publication Data

US 2014/0085849 A1 Mar. 27, 2014

(30) Foreign Application Priority Data

Sep. 24, 2012 (FI) ...................................... 20125982

(51) Int. Cl.
| | |
|---|---|
| *H05K 1/00* | (2006.01) |
| *H05K 7/12* | (2006.01) |
| *H01G 9/004* | (2006.01) |
| *H01G 2/06* | (2006.01) |

(52) U.S. Cl.
CPC ................ *H05K 7/12* (2013.01); *H01G 2/06* (2013.01); *H01G 9/004* (2013.01); *H01L 2924/0002* (2013.01)

(58) Field of Classification Search
CPC . H05K 7/12; H01G 2/06; H01G 9/004; H01L 2924/0002
USPC .................... 174/252; 361/709, 679.01, 710, 361/712–715, 722
See application file for complete search history.

(56) References Cited

U.S. PATENT DOCUMENTS

| | | | | |
|---|---|---|---|---|
| 5,979,025 | A | * | 11/1999 | Horng ................. H01L 23/4093 165/80.3 |
| 6,504,243 | B1 | | 1/2003 | Andric et al. |
| 7,426,112 | B2 | * | 9/2008 | Chi-Wei ............. H01L 23/4093 165/104.26 |

(Continued)

FOREIGN PATENT DOCUMENTS

EP     1 160 863 A2   12/2007

OTHER PUBLICATIONS

Finnish Search Report, dated Jun. 19, 2013, from corresponding Finnish application.

(Continued)

*Primary Examiner* — Tremesha S Willis
(74) *Attorney, Agent, or Firm* — Young & Thompson (57) ABSTRACT

A circuit board system according to the invention comprises a circuit board (101), at least one element (102) mechanically supported with respect to the circuit board, and a spring-fastener (106) arranged to mechanically support the at least one element with respect to the circuit board. The spring-fastener comprises a pressing portion (107) pressing the at least one element and a latching portion (108) extending from an end of the pressing portion and being shape-locked in one or more apertures (109-110) of the circuit board. The latching portion and the one or more apertures of the circuit board are shaped to provide shape-locking whose opening requires at least a first movement of the latching portion in a first direction against the spring-force of the spring fastener and, subsequently, a second movement of the latching portion in a second direction against the spring-force of the spring fastener.

7 Claims, 7 Drawing Sheets

(56) References Cited

U.S. PATENT DOCUMENTS

| | | | |
|---|---|---|---|
| 8,063,485 B1 * | 11/2011 | Azar | ............... H01L 23/4006 257/706 |
| 2005/0135064 A1 | 1/2005 | Chen et al. | |
| 2006/0156857 A1 | 7/2006 | Turner et al. | |
| 2009/0154109 A1 | 6/2009 | Chen et al. | |
| 2010/0172102 A1 | 7/2010 | Sass et al. | |
| 2011/0141699 A1 | 6/2011 | Hager et al. | |

OTHER PUBLICATIONS

Aug. 31, 2017, European Search Report issued for related EP Application No. 13185069.

* cited by examiner

CIRCUIT BOARD SYSTEM COMPRISING A SPRING FASTENED ELEMENT

FIELD OF THE INVENTION

The invention relates to a circuit board system comprising at least one element mechanically supported with a spring-fastener.

BACKGROUND

A typical circuit board system comprises a circuit board furnished with electrical components. The circuit board comprises a body made of one or more layers of electrically insulating material and electrical conductors on one or both of the surfaces of the circuit board and/or between the layers of the electrically insulating material. Each of the electrical components can be, for example, an integrated circuit such as a processor or a memory, or a discrete component such as a resistor, a capacitor, an inductor, a transistor, or a diode. Furthermore, the circuit board system may comprise also other elements than electrical components. Examples of the other elements are heat sinks and mechanical support arms. Commonly used means for attaching elements such as heat sinks and mechanical support arms are spring-fasteners because they are relatively cost-effective and easy to assemble and disassemble.

Publication US20090154109 describes a circuit board system comprising a heat sink thermally contacted with an electronic component and a spring-fastener securing the heat sink to a circuit board. The spring-fastener comprises a pressing portion disposed on the heat sink and a pair of resilient latching portions extending from opposite ends of the pressing portion. Each latching portion comprises a hook for engaging with a corresponding securing member mounted on the circuit board.

A circuit board system can be subjected to unintentional mechanical impacts in many situations, and there have been cases where a spring-fastener of the kind described above has been unintentionally opened when handling a circuit board system. Therefore, there is a need for secure spring-fasteners so as to minimize the risk of unintentional opening.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new circuit board system that can be, for example but not necessarily, a part of telecommunication equipment. The circuit board system according to the invention comprises:
 a circuit board,
 at least one element mechanically supported with respect to the circuit board on a first side of the circuit board, and
 a spring-fastener arranged to mechanically support the at least one element with respect to the circuit board, the spring-fastener comprising a pressing portion pressing the at least one element and a latching portion extending from an end of the pressing portion and being shape-locked in one or more apertures of the circuit board.

The above-mentioned latching portion and the one or more apertures of the circuit board are shaped to provide shape-locking whose opening requires at least a first movement of the latching portion in a first direction against the spring-force of the spring fastener and subsequently a second movement of the latching portion in a second direction against the spring-force of the spring fastener, where the first and second directions are mutually intersecting. The need for the first and second mutually intersecting movements against the spring-force for opening the shape-locking is achieved with the shapes of the latching portion and the one or more apertures of the circuit board. The latching portion includes a hook made of wire and a body portion extending from the hook to the end of the pressing portion. The hook is formed by a tip portion and a connection portion between the tip portion and the body portion of the latching portion. The apertures of the circuit board include (i) a first aperture through which the body portion of the latching portion extends from the first side of the circuit board to the second side of the circuit board and (ii) a second aperture which is located with respect to the first aperture so that the connection portion of the hook is disposed, on a second side of the circuit board, adjacent an isthmus between the first and second apertures and the tip portion of the hook extends, from the second side of the circuit board towards the first side of the circuit board, through the second aperture. The first aperture has an elongated form and is positioned so that moving the tip and connection portions of the hook through the first aperture from the second side of the circuit board to the first side of the circuit board requires twisting the hook so that an end of the body portion of the latching portion connected to the connection portion of the hook is rotated against torsional spring-force of the body portion of the latching portion so that an axis of rotation is substantially perpendicular to the circuit board.

In a circuit board system according to an non-limiting exemplifying embodiment of the invention, the latching portion of the spring-fastener comprises a hook made of wire and the apertures of the circuit board comprise a first aperture dimensioned so that the hook is capable of being moved through the first aperture and a second aperture which is located with respect to the first aperture so that the hook is fitted to an isthmus between the first and second apertures and the tip portion of the hook extends through the second aperture. Advantageously, the first aperture has an elongated form and is positioned so that moving the hook through the first aperture requires twisting the hook against torsional spring-force of the wire.

In a circuit board system according to another non-limiting exemplifying embodiment of the invention, the latching portion of the spring-fastener comprises a strip provided with an aperture and the aperture of the circuit board is shaped to form a collet extending through the aperture of the latching portion of the spring-fastener. The collet comprises a narrower neck portion and a wider end portion and the aperture of the latching portion of the spring-fastener comprises a first portion wider than the end portion of the collet and a second portion narrower than the end portion of the collet but wider than the neck portion of the collet. The spring-force of the spring-fastener is arranged to keep the latching portion so that the neck portion of the collet is through the second portion of the aperture of the latching portion.

A number of other non-limiting exemplifying embodiments of the invention are described in accompanied dependent claims.

Various non-limiting exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in depending claims are mutually freely combinable unless otherwise explicitly stated.

BRIEF DESCRIPTION OF THE FIGURES

The exemplifying embodiments of the invention and their advantages are explained in greater detail below in the sense of examples and with reference to the accompanying drawings, in which.

DESCRIPTION OF THE EXEMPLIFYING EMBODIMENTS

Figure 1A:
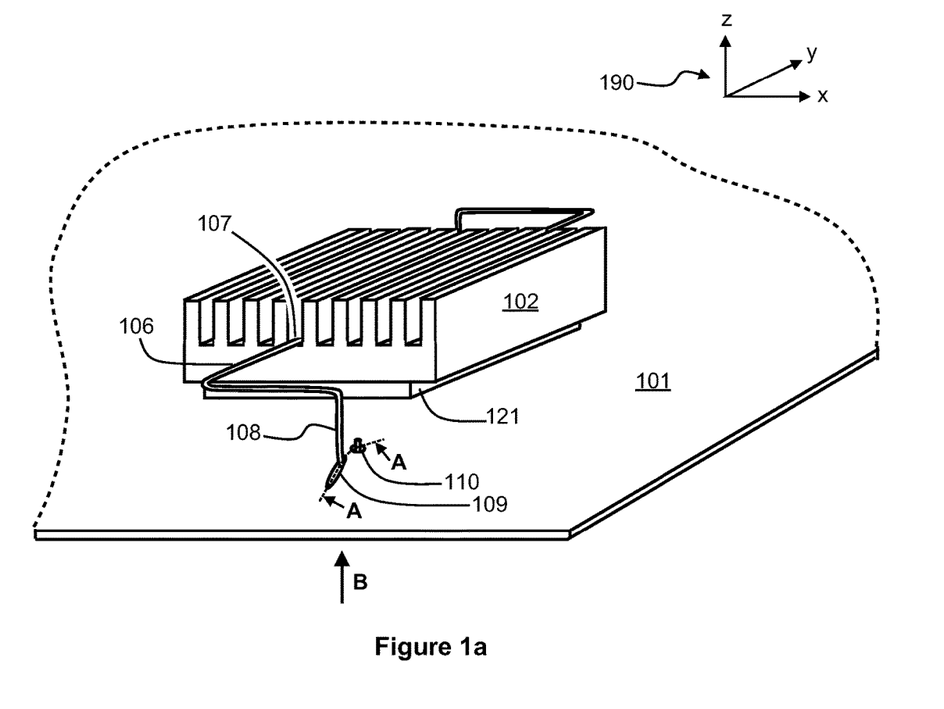
FIGS. 1a, 1b and 1c illustrate a circuit board system according to an exemplifying embodiment of the invention.
Figure 1B:
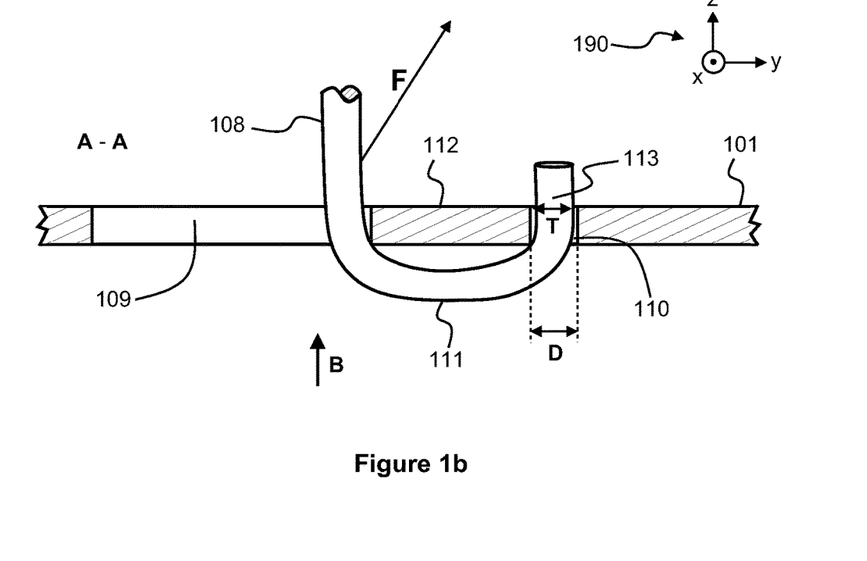
Figure 1C:
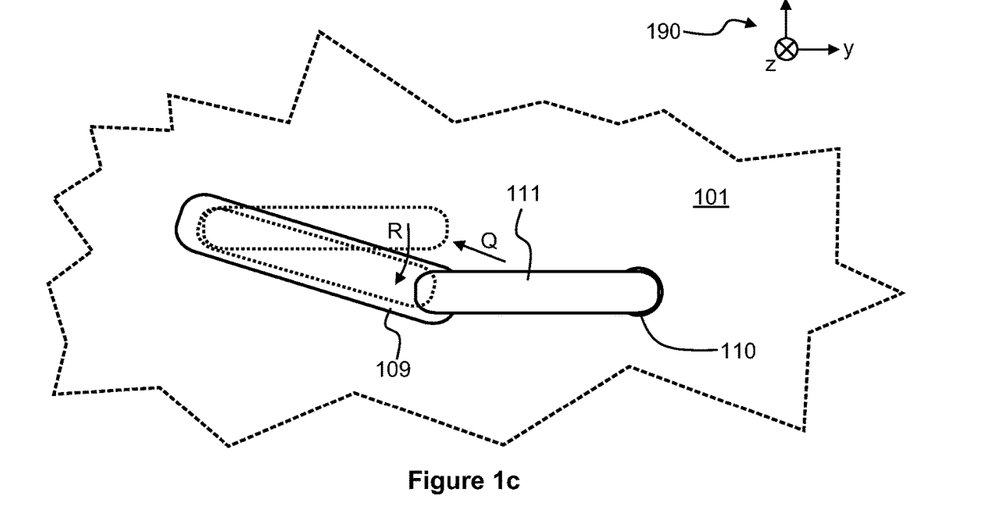

FIG. 1a shows a perspective view of a circuit board system according to exemplifying embodiments of the invention. FIG. 1b shows a schematic view of a section taken along the arc A-A shown in FIG. 1a. FIG. 1c illustrates a view seen along the arrow B shown in FIGS. 1a and 1b. The circuit board system comprises a circuit board 101 furnished with electrical components one of which is denoted with a reference number 121. The circuit board system can be, for example but not necessarily, a part of telecommunication equipment and it may comprise, for example, a processing system for supporting at least one of the following data transfer protocols: Internet Protocol "IP", Ethernet protocol, MultiProtocol Label Switching "MPLS" protocol, Asynchronous Transfer Mode "ATM".

The circuit board system comprises an element 102 that is mechanically supported with respect to the circuit board 101. In the exemplifying case illustrated in FIGS. 1a-1c, the element 102 is a heat sink having a first surface in heat conducting relation with the electronic component 121 that is located between the heat sink and the circuit board 101. The circuit board system comprises a spring-fastener 106 that comprises a pressing portion 107 pressing the heat sink against the electrical component 121. The spring-fastener 106 comprises a latching portion 108 that extends from an end of the pressing portion 107 and is shape-locked in apertures of the circuit board 101 so that opening of the shape-locking requires at least a first movement of the latching portion in a first direction against the spring-force of the spring fastener and, subsequently, a second movement of the latching portion in a second direction against the spring-force of the spring fastener, where the first and second directions are mutually intersecting. In the exemplifying case illustrated in FIGS. 1a-1c, the spring-fastener 106 is made of wire of spring material, e.g. steel. The wire can be a round wire or, alternatively, the wire may have a non-circular cross-section. The latching portion 108 of the spring fastener comprises a hook 111 and the apertures of the circuit board comprise a first aperture 109 dimensioned so that the hook is capable of being moved through the first aperture and a second aperture 110 which is located with respect to the first aperture so that the hook is fitted to an isthmus 112 between the first and second apertures and the tip portion 113 of the hook extends through the second aperture as illustrated in FIG. 1b. The diameter D of the second aperture 110 is preferably arranged to match to the diameter T of the tip portion 113 of the hook 111 so that the direction of the first movement needed for opening the shape-locking is substantially determined by the walls of the second aperture 110.

As can be seen from FIGS. 1a and 1b, the hook 111 has to be first moved in the negative z-direction of a coordinate system 190 so as to release the tip portion 113 of the hook from the second aperture 110, and subsequently the hook has to be moved in the negative y-direction so as to position the hook to be capable of being moved through the first aperture 109. The spring-fastener 106 is tensioned in its normal operating position illustrated in FIGS. 1a and 1b so that both the movement in the negative z-direction and the movement in the negative y-direction are against the spring-force of the spring-fastener. The resultant spring-force is illustrated with a vector F in FIG. 1b.

In a circuit board system according to an exemplifying embodiment of the invention, the first aperture 109 has an elongated form and it is positioned so that moving the hook 111 through the first aperture requires twisting the hook against the torsional spring-force of the wire. This is illustrated in FIG. 1c which shows the view seen along the arrow B shown in FIGS. 1a and 1b. Opening the shape-locking requires firstly a movement in the negative z-direction so as to release the tip portion of the hook from the second aperture 110, and secondly a transitional movement Q together with a rotation R illustrated in FIG. 1c, where the movement in the negative z-direction and the movement Q are against the spring-force and the rotation R is against the torsional spring-force of the wire.

Only one end of the spring fastener 106, i.e. the end comprising the latching portion 108, is visible in FIG. 1a. The other end of the spring fastener comprises preferably a similar hook arrangement as the end comprising the latching portion 108. It is also possible that the other end of the spring-fastener comprises a different arrangement for engaging with the circuit board, e.g. an extension securing to a slot of the circuit board.

Figure 2A:
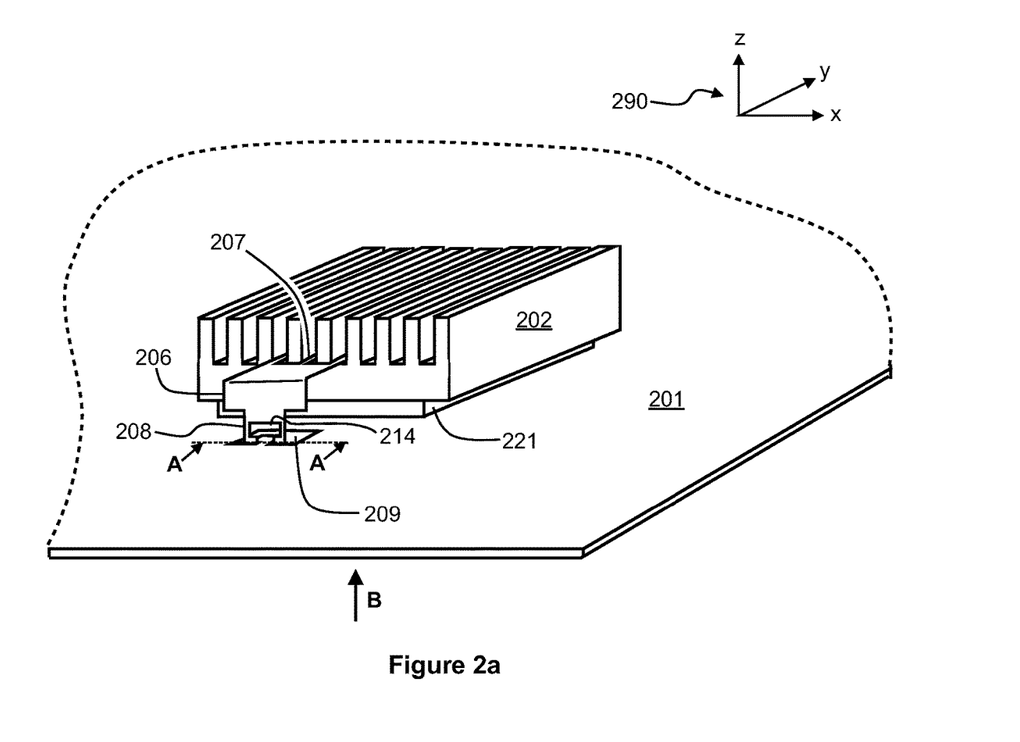
FIGS. 2a, 2b and 2c illustrate a circuit board system according to an exemplifying embodiment of the invention.
Figure 2B:
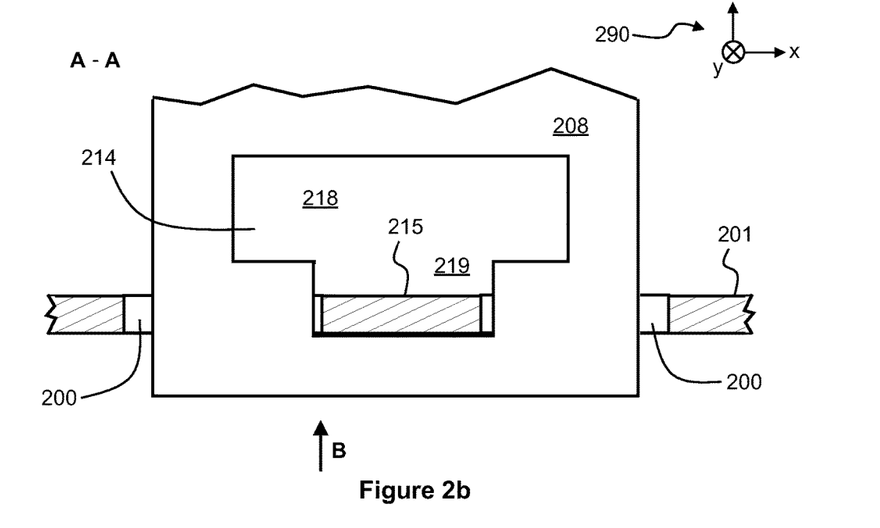
Figure 2C:
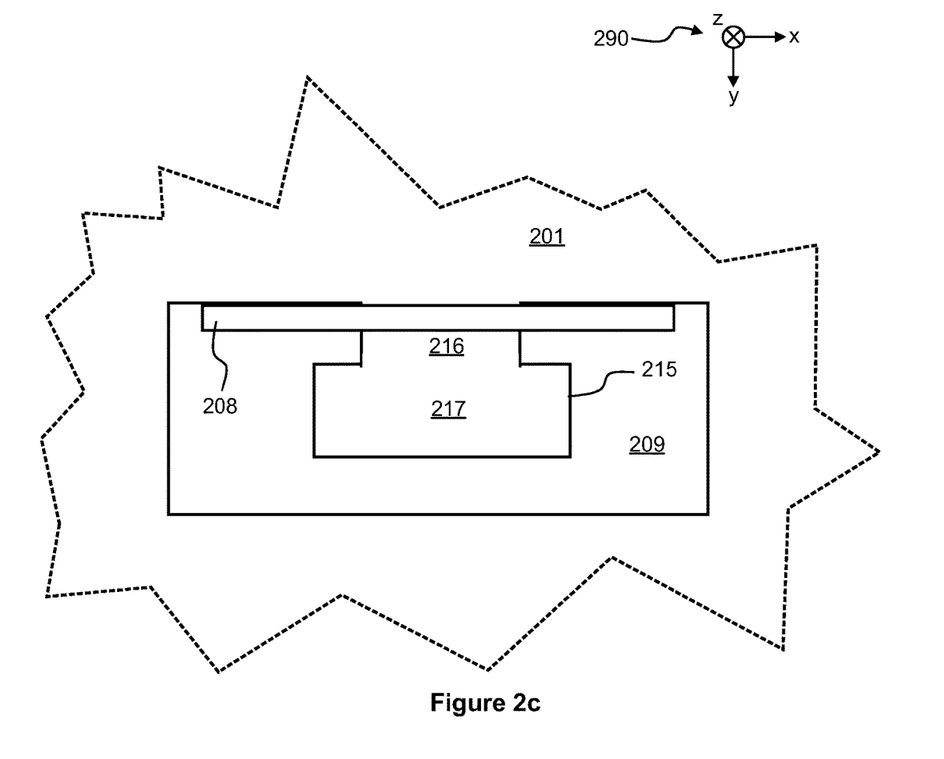

FIG. 2a shows a perspective view of a circuit board system according to an exemplifying embodiment of the invention. FIG. 2b shows a schematic view of a section taken along the line A-A shown in FIG. 2a. FIG. 2c illustrates a view seen along the arrow B shown in FIGS. 2a and 2b. The circuit board system comprises a circuit board 201 furnished with electrical components one of which is denoted with a reference number 221. The circuit board system comprises an element 202 that is mechanically supported with respect to the circuit board. In the exemplifying case illustrated in FIGS. 2a-2c, the element 202 is a heat sink having a first surface in heat conducting relation with the electronic component 221 that is located between the heat sink and the circuit board 201. The circuit board system comprises a spring-fastener 206 that comprises a pressing portion 207 pressing the heat sink against the electrical component 221. In the exemplifying case illustrated in FIGS. 2a-2c, the spring-fastener 206 is made of a flat strip of spring material, e.g. steel. The pressing portion 207 of the spring-fastener comprises elongated apertures through which two cooling fins of the heat sink are extending as illustrated in FIG. 2a so as to provide stable mechanical support for the heat sink. The spring-fastener 206 comprises a latching portion 208 that extends from an end of the pressing portion 207 and is shape-locked in an aperture 209 of the circuit board 201 so that opening of the shape-locking requires at least a first movement of the latching portion in a first direction against the spring-force of the spring fastener and, subsequently, a second movement of the latching portion in a second direction against the spring-force of the spring fastener, where the first and second directions are mutually intersecting.

The latching portion 208 of the spring material is provided with an aperture 214 and the aperture 209 of the circuit board is shaped to form a collet 215 extending through the aperture of the latching portion. The aperture 214 of the latching portion and the collet 215 are illustrated in FIGS. 2b and 2c. The collet comprises a narrower neck portion 216 and a wider end portion 217 as illustrated in FIG. 2c. The aperture 214 of the latching portion 208 comprises a first portion 218 that is, in the direction parallel to the circuit board, wider than the end portion 217 of the collet and a second portion 219 that is, in the direction parallel to the circuit board, narrower than the end portion 217 of the collet 215 but wider than the neck portion 216 of the collet 215. The spring-force of the spring-fastener 206 is arranged to keep the latching portion 208 so that the neck portion 216 of the collet 215 is through the second portion 219, i.e. the narrower portion, of the aperture 214 as illustrated in FIGS. 2b and 2c.

As can be seen from FIGS. 2b and 2c, the latching portion 208 has to be first moved in the negative z-direction of a coordinate system 290 so as to align the first portion 218 of the aperture 214 with the collet 215, and subsequently the lathing portion 208 has to be moved in the positive y-direction so as to release the latching portion 208 from the collet 215. The spring-fastener 206 is tensioned in its normal operating position illustrated in FIGS. 2a-2c so that both of the above-mentioned movements are against the spring-force of the spring-fastener.

Only one end of the spring fastener 206, i.e. the end comprising the latching portion 208, is visible in FIG. 1a. The other end of the spring fastener comprises preferably a similar arrangement as the end comprising the latching portion 208. It is also possible that the other end of the spring-fastener comprises a different arrangement for engaging with the circuit board, e.g. a sharply bent edge securing to a narrow slot of the circuit board.

Figure 3A:
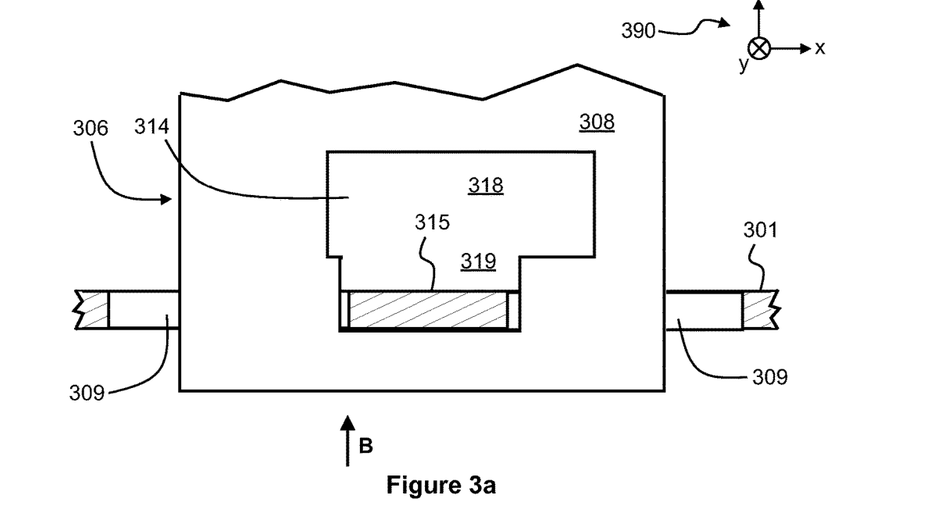
FIGS. 3a and 3b illustrate a detail of a circuit board system according to an exemplifying embodiment of the invention.
Figure 3B:
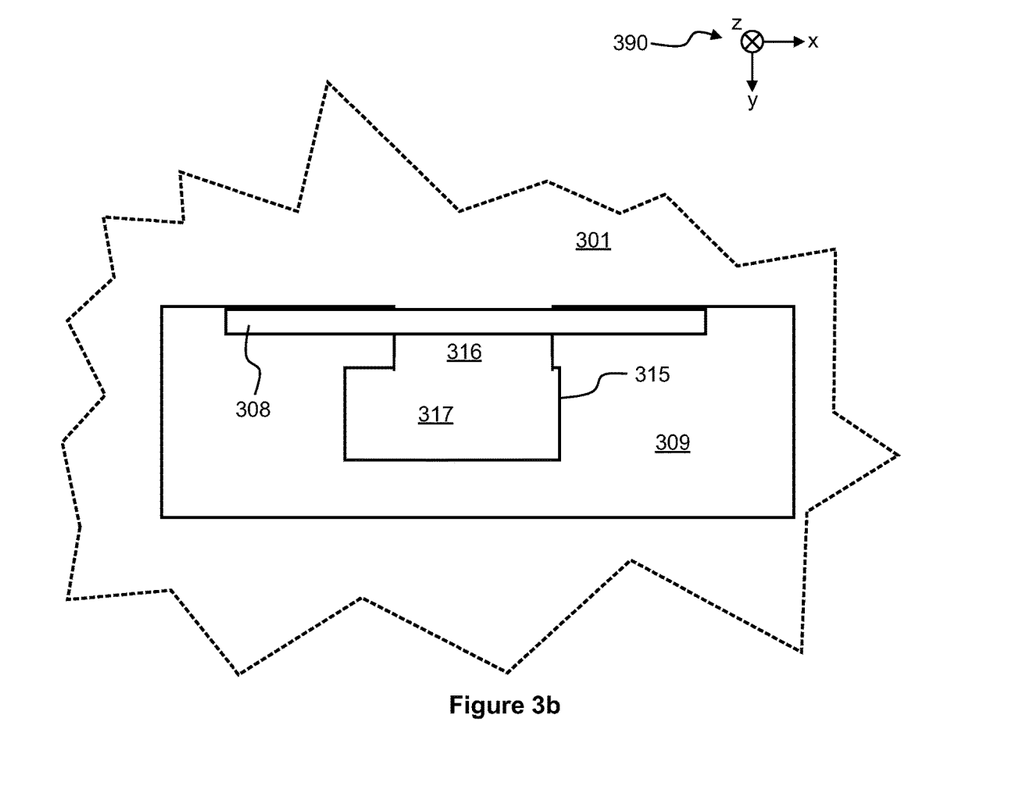

FIGS. 3a and 3b illustrate a detail of a circuit board system according to an exemplifying embodiment of the invention. FIGS. 3a and 3b illustrate a part of a circuit board 301 of the circuit board system, a latching portion 308 of a spring-fastener 306, and an aperture 309 of the circuit board. The aperture 309 of the circuit board is shaped to form a collet 315 that is asymmetric so that an end portion 317 of the collet constitutes a wider shoulder on a first side-edge of the collet than on a second side-edge of the collet as illustrated in FIG. 3b. The aperture 314 of the latching portion 308 is asymmetric so that first and second portions 318 and 319 of the aperture constitute a wider shoulder on a first edge of the aperture than on a second edge of the aperture as illustrated in FIG. 3a. As can be seen from FIGS. 3a and 3b, the latching portion 308 has to be firstly moved in the negative z-direction of a coordinate system 390, secondly the latching portion 308 has to be moved in the negative x-direction, and thirdly the latching portion 308 has to be moved in the positive y-direction so as to release the latching portion 308 from the collet 315. The spring-fastener 306 is preferably tensioned in its normal operating position illustrated in FIGS. 3a and 3b so that the above-mentioned movements in the negative z-direction and in the positive y-direction are against the spring-force of the spring-fastener.

Figure 4A:
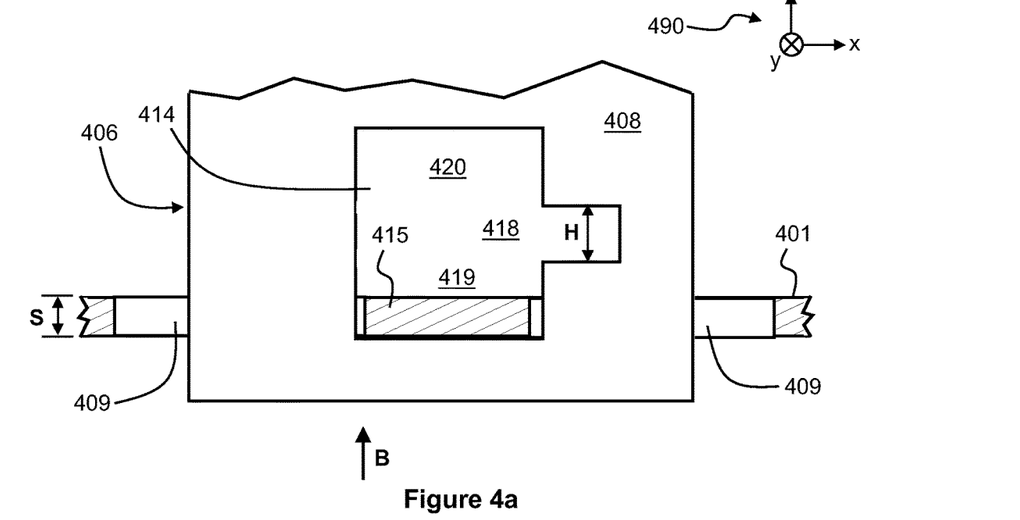
FIGS. 4a and 4b illustrate a detail of a circuit board system according to an exemplifying embodiment of the invention.
Figure 4B:
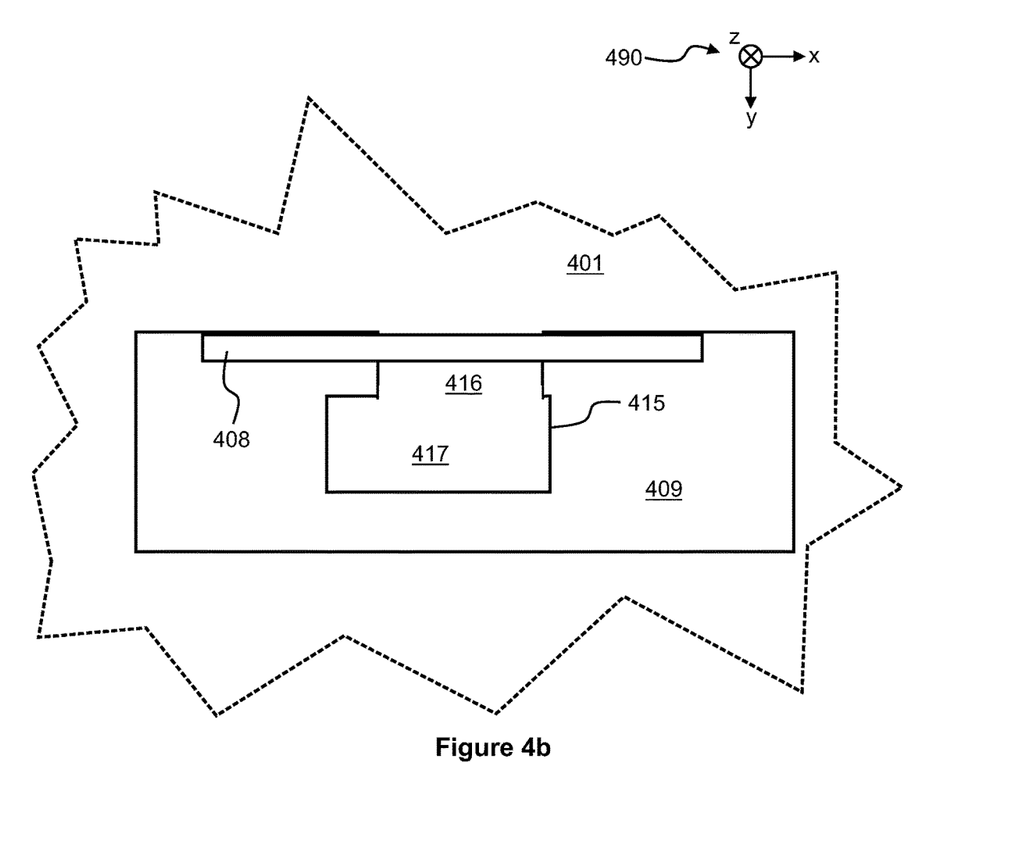

FIGS. 4a and 4b illustrate a detail of a circuit board system according to an exemplifying embodiment of the invention. FIGS. 4a and 4b illustrate a part of a circuit board 401 of the circuit board system, a latching portion 408 of a spring-fastener 406, and an aperture 409 of the circuit board shaped to form a collet 415. The detail of the circuit board system illustrated in FIGS. 4a and 4b is otherwise similar to that illustrated in FIGS. 3a and 3b but an aperture 414 of the latching portion 408 comprises, in addition to first and second portions 418 and 419, a third portion 420 that is narrower than an end portion 417 of the collet 415 but wider than a neck portion 416 of the collet. As illustrated in FIG. 4a, the first portion 418 of the aperture 414 is between the second and third portions 419 and 420 of the aperture 414. The third portion 420 of the aperture 414 extends the range of movement of the latching portion 408 in the direction perpendicular to the circuit board, i.e. in the z-direction of a coordinate system 490. The third portion 420 of the aperture 414 decreases the risk of unintentional opening of the spring-fastener because the latching portion 408 is capable of being released from the collet 415 only at the middle of the z-directional range of movement. As can be seen from FIGS. 4a and 4b, the latching portion 408 has to be firstly moved in the negative z-direction about a half of its z-directional range of movement, secondly the latching portion 408 has to be moved in the negative x-direction, and thirdly the latching portion 408 has to be moved in the positive y-direction so as to release the latching portion 408 from the collet 415. When the latching portion 408 is unintentionally moved in the negative z-direction there is a significant probability that the latching portion 408 is moved more or less than it should be moved for opening the spring-fastener 406. Hence, the risk of unintentional opening is reduced. The spring-fastener 406 is preferably tensioned in its normal operating position illustrated in FIGS. 4a and 4b so that the above-mentioned movements in the negative z-direction and in the positive y-direction are against the spring-force of the spring-fastener.

Figure 4C:
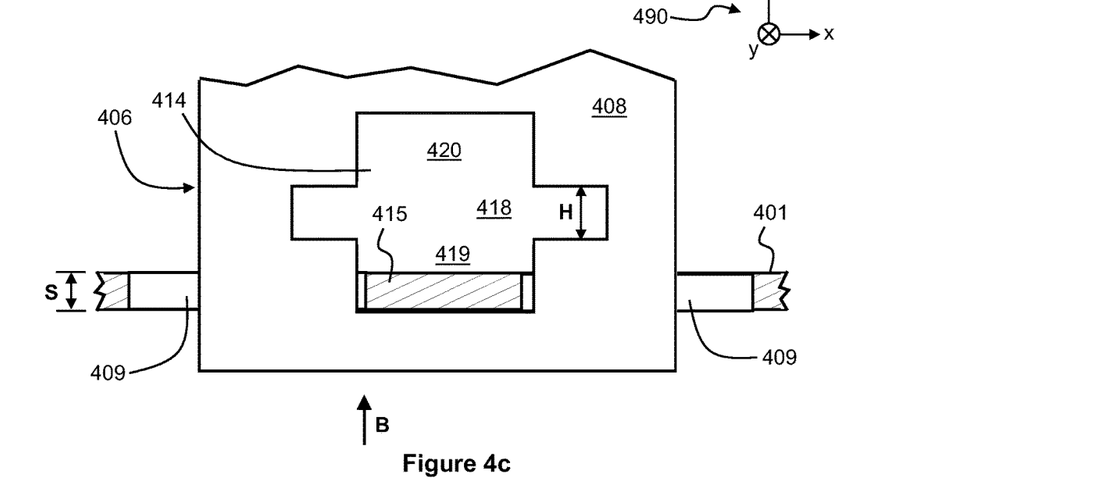
FIGS. 4c and 4d illustrate a detail of a circuit board system according to an exemplifying embodiment of the invention.
Figure 4D:
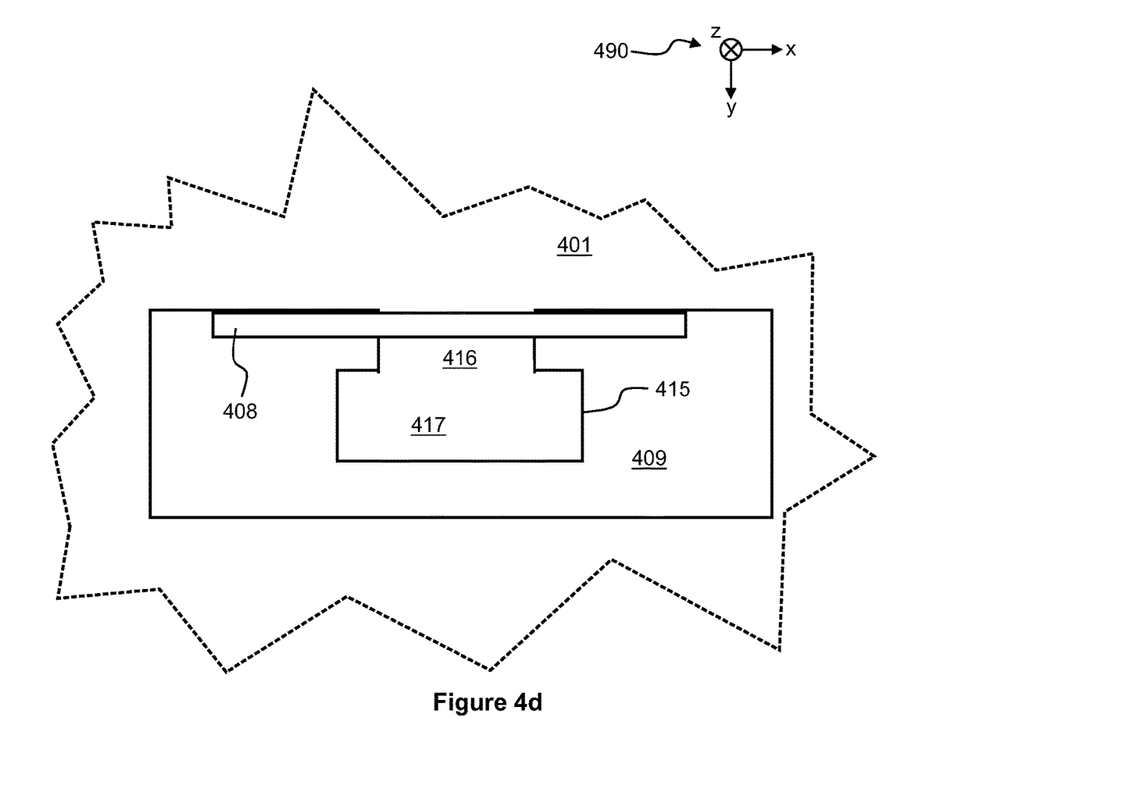

It is to be noted that the principle of using an extended range of movement illustrated in FIGS. 4a and 4b is also applicable when there are a symmetric collet in the circuit board and a symmetric aperture in the latching portion as in the case illustrated in FIGS. 4c and 4d.

In a circuit board system according to an exemplifying embodiment of the invention, the height H of the second portion 418 of the aperture 414 in the direction perpendicular to the circuit board 401 is at most 25% greater than the thickness S of the circuit board. In a circuit board system according to another exemplifying embodiment of the invention, the height H of the second portion 418 is at most 10% greater than the thickness S of the circuit board. There is a trade-off so that making the height H nearer and nearer to the thickness S of the circuit board reduces the risk of unintentional opening of the spring fastener but, on the other hand, the installation and intentional opening require more accuracy and thus are slower to carry out.

In a circuit board system according to an exemplifying embodiment of the invention, the height H of the second portion 418 of the aperture 414 in the direction perpendicular to the circuit board 401 is at most one third of the total height of the aperture 414 in the direction perpendicular to the circuit board.

Figure 5:
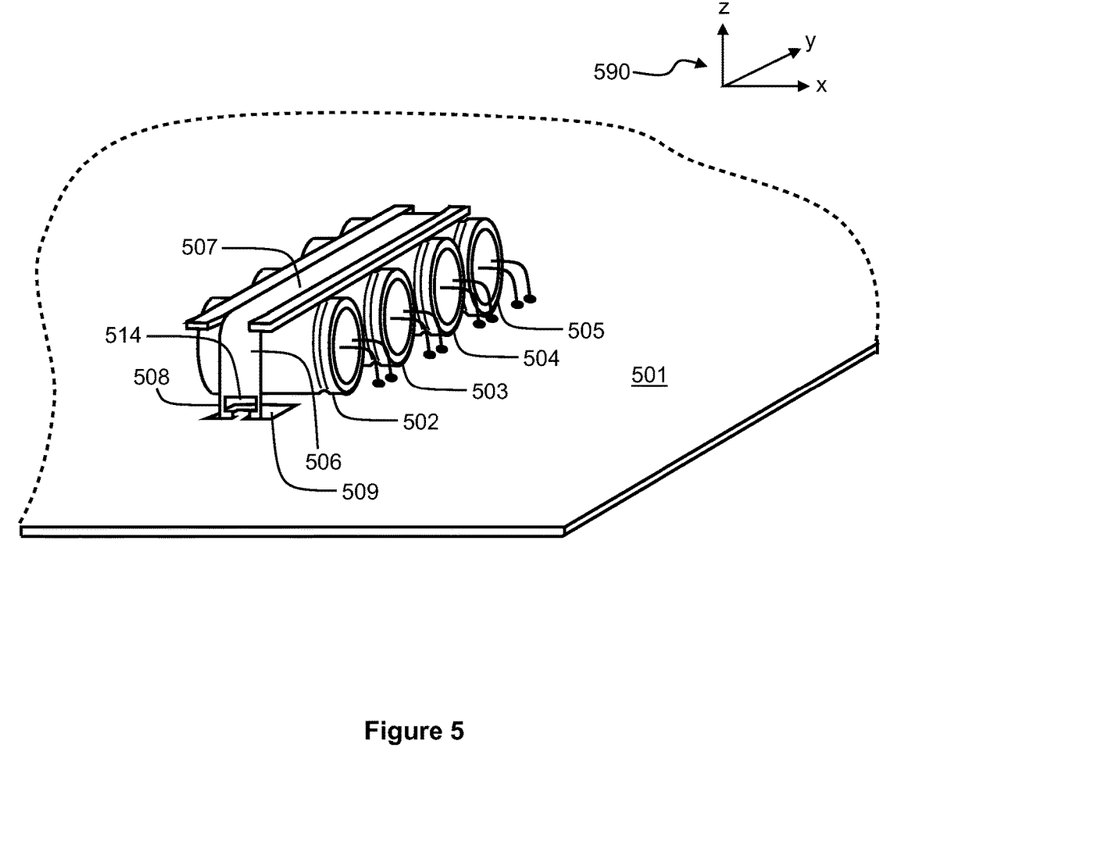
FIG. 5 illustrates a circuit board system according to an exemplifying embodiment of the invention.

FIG. 5 illustrates a circuit board system according to an exemplifying embodiment of the invention. The circuit board system comprises a circuit board 501 and elements 502, 503, 504, and 505 that are mechanically supported with respect to the circuit board. In the exemplifying case illustrated in FIG. 5, the elements 502-505 are electrical components which are electrically connected to the circuit board with electrical wires. The electrical components can be, for example, electrolytic capacitors. The circuit board system comprises a spring-fastener 506 comprising a pressing portion 507 that constitutes a part of a support arm mechanically supporting the elements 502-505. The spring-fastener 506 comprises a latching portion 508 that extends from an end of the pressing portion 507 and is shape-locked in an aperture 509 of the circuit board 501 so that opening of the shape-locking requires at least a first movement of the latching portion in a first direction against the spring-force of the spring fastener and, subsequently, a second movement of the latching portion in a second direction against the spring-force of the spring fastener, where the first and second directions are mutually intersecting.

In the exemplifying case illustrated in FIG. 5, the spring-fastener 506 is made of a flat strip of spring material, e.g. steel. The latching portion 508 of the spring material is provided with an aperture 514 and the aperture 509 of the circuit board is shaped to form a collet extending through the aperture of the latching portion. The aperture 514 of the latching portion 508 and the above-mentioned collet can be, for example, such as presented in FIGS. 2b and 2c, or in FIGS. 3a and 3b, or in FIGS. 4a and 4b. Only one end of the spring fastener 506, i.e. the end comprising the latching portion 508, is visible in FIG. 5. The other end of the spring fastener comprises preferably a similar arrangement as the end comprising the latching portion 508. It is also possible that the other end of the spring-fastener comprises a different arrangement for engaging with the circuit board, e.g. a sharply bent edge securing to a narrow slot of the circuit board.

The specific examples provided in the description given above should not be construed as limiting the applicability and/or the interpretation of the appended claims.

What is claimed is:

1. A circuit board system comprising:
    a circuit board;
    at least one element mechanically supported with respect to the circuit board on a first side of the circuit board; and
    a spring-fastener configured to mechanically support the at least one element with respect to the circuit board, the spring-fastener comprising
        a pressing portion pressing the at least one element, and
        a latching portion extending from an end of the pressing portion and being shape-locked in one or more apertures of the circuit board,
    wherein the latching portion and the one or more apertures of the circuit board are shaped to provide shape-locking whose opening requires at least a first movement of the latching portion in a first direction against spring-force of the spring fastener and, subsequently, a second movement of the latching portion in a second direction against the spring-force of the spring fastener, the first and second directions being mutually intersecting, the shapes of the latching portion and the one or more apertures of the circuit board being configured to require a need for the first and second mutually intersecting movements against the spring-force to open the shape-locking,
    the latching portion comprises a hook made of wire and a body portion extending from the hook to the end of the pressing portion,
    the hook is formed by a tip portion and a connection portion between the tip portion and the body portion of the latching portion,
    the apertures of the circuit board comprise (i) a first aperture through which the body portion of the latching portion extends from the first side of the circuit board to the second side of the circuit board, and (ii) a second aperture which is located with respect to the first aperture so that the connection portion of the hook is disposed, on a second side of the circuit board, adjacent an isthmus between the first and second apertures, and the tip portion of the hook extends, from the second side of the circuit board towards the first side of the circuit board, through the second aperture, and
    the first aperture has an elongated form and is positioned so that moving the tip portion and the connection portion of the hook through the first aperture from the second side of the circuit board to the first side of the circuit board requires twisting the hook so that an end of the body portion of the latching portion connected to the connection portion of the hook is rotated against torsional spring-force of the body portion of the latching portion so that an axis of rotation is substantially perpendicular to the circuit board.

2. The circuit board system according to claim 1, wherein a diameter of the second aperture matches a diameter of the tip portion of the hook to arrange the first direction to be substantially determined by walls of the second aperture.

3. The circuit board system according to claim 1, wherein the element is a heat sink having a first surface in heat conducting relation with an electronic component between the heat sink and the circuit board, the pressing portion of the spring-fastener pressing the heat sink against the electronic component.

4. The circuit board system according to claim 3, wherein the pressing portion of the spring-fastener comprises at least one aperture through which a cooling fin of the heat sink is extending.

5. The circuit board system according to claim 1, wherein the at least one element is at least one electrical component electrically connected to the circuit board and the pressing portion of the spring-fastener constitutes at least a part of a support arm mechanically supporting the at least one electrical component.

6. The circuit board system according to claim 5, wherein each of the at least one electrical component is an electrolytic capacitor.

7. The circuit board system according to claim 1, wherein the circuit board system comprises a processing system configured to support at least one of the following data transfer protocols: Internet Protocol (IP), Ethernet protocol, MultiProtocol Label Switching (MPLS) protocol, and Asynchronous Transfer Mode (ATM).

\* \* \* \* \*